United States Patent
Nakada et al.

(10) Patent No.: US 6,819,042 B2
(45) Date of Patent: Nov. 16, 2004

(54) ORGANIC EL DEVICE AND METHOD FOR ITS MANUFACTURE

(75) Inventors: Hitoshi Nakada, Yonezawa (JP); Hiroshi Ohata, Yonezawa (JP); Yoshitaka Nonaka, Yonezawa (JP); Atsushi Nishino, Neyagawa (JP); Yohei Kawaguchi, Osaka (JP); Masayuki Fujimori, Shiga-ken (JP); Kaneto Ohyama, Shiga-ken (JP)

(73) Assignees: Dynic Corporation, Kyoto-fu (JP); Tohoku Pioneer Corporation, Yamagata-ken (JP)

( * ) Notice: Subject to any disclaimer, the term of this patent is extended or adjusted under 35 U.S.C. 154(b) by 0 days.

(21) Appl. No.: 09/854,067

(22) Filed: May 10, 2001

(65) Prior Publication Data

US 2002/0050785 A1 May 2, 2002

(30) Foreign Application Priority Data

May 17, 2000 (JP) ........................................ 2000-145627

(51) Int. Cl.$^7$ ................................................. H01J 1/52
(52) U.S. Cl. .......................... 313/504; 428/69; 438/145
(58) Field of Search .............................. 313/504, 506, 313/512; 428/69; 438/145

(56) References Cited

U.S. PATENT DOCUMENTS

| 5,882,761 A | 3/1999 | Kawami et al. ............... 428/69 |
| 6,226,890 B1 | 5/2001 | Boroson et al. |
| 6,410,368 B1 * | 6/2002 | Kawasaki et al. ........... 438/145 |

FOREIGN PATENT DOCUMENTS

| JP | 2002-018227 | 1/2002 |
| JP | 2002-280166 | 9/2002 |

* cited by examiner

*Primary Examiner*—Renee Luebke
(74) *Attorney, Agent, or Firm*—Knobbe, Martens, Olson & Bear LLP

(57) ABSTRACT

There is provided a more expedient and positive desiccating means for an organic EL device. The invention relates to an organic EL device comprising 1) a laminate consisting of an opposed pair of electrodes and an organic light-emitting layer sandwiched between the electrodes, 2) a gas-tight housing accommodating the laminate and shielding off the external atmosphere and 3) a desiccating means disposed in isolation from the laminate within the gas-tight housing, characterized in that a preformed moisture-absorbing artifact as the desiccating means is fixedly secured to at least one part of the gas-tight housing and further to a method of manufacturing the same device.

9 Claims, 7 Drawing Sheets

ORGANIC EL DEVICE AND METHOD FOR ITS MANUFACTURE

FIELD OF THE INVENTION

The present invention relates to a novel organic electroluminescent device and a method of manufacturing the same.

BACKGROUND OF THE INVENTION

The organic EL (electroluminescent) device is a structural entity comprising an organic light-emitting layer comprised of an organic compound sandwiched between a pair of electrodes. The organic EL, which is expected to find application in flat panel displays and similar devices, has various characteristics such as high-luminance emission, high-speed response, high energy-converting rate, and high color development.

However, when an organic EL device is driven for long periods of time, the device suffers a degradation in light emission characteristics such as a decrease in overall emission luminosity and a loss of uniformity that produces dark spots. For instance, moisture may be adsorbed from the surfaces of component parts of the organic EL device and propagate into the laminate, which consists of a pair of electrodes with a light-emitting substance sandwiched therebetween, via surface defects in the negative electrode. The resulting delamination between the light-emitting substance and the negative electrode blocks the flow of an electric current to cause photoemission-free spots that appear as dark spots.

To eliminate this drawback of dark spots, it is essential to reduce the level of humidity within the organic EL device. One means for reducing humidity in an organic EL is the use of a protective layer containing a desiccant and a sealing layer that are disposed adjacent to the laminate containing the positive electrode, organic light-emitting substance, and negative electrode (Japanese Unexamined Patent Publication H7-169567).

However, the use of such protective layers gives rise to other problems. For instance, the protective layer results in an increased risk leak currents and a cross talk, both of which tend to produce undesired effects on the photoemission characteristics of the device.

Another method that is used to resolve the moisture problem is the use of an organic EL device comprising a gas-tight housing containing a laminate consisting of a pair of electrodes and an organic electroluminescent substance layer sandwiched between the electrodes. A desiccating means is disposed apart from the laminate comprising diphosphorus pentoxide ($P_2O_5$) in a hermetically sealed condition (Japanese Unexamined Patent Publication H3-261091).

However, with this technology, the desiccant $P_2O_5$ absorbs atmospheric moisture and dissolves to give phosphoric acid which would adversely affect the laminate. Moreover, the method which can be used for sealing the desiccant $P_2O_5$ into the housing is limited so that the technology is not suited for commercial-scale production.

SUMMARY OF THE INVENTION

A primary object of the present invention is to provide a more expedient and positive desiccating means for use in an organic EL device.

The inventor of the present invention did much research with the above drawbacks of the prior art in mind and found that the above object can be accomplished by fixing a preformed moisture-absorbing body within a gas-tight housing. The present invention has accordingly been developed.

The present invention, therefore, is directed to the following organic EL devices and methods of manufacturing them.

1. An organic EL device comprising 1) a laminate consisting of a pair of electrodes and an organic light-emitting layer sandwiched therebetween, 2) a gas-tight housing accommodating said laminate and shielding off the external atmosphere and 3) a desiccating means disposed apart from said laminate within said airtight housing, characterized in that a preformed moisture-absorbing body as said desiccating means is fixedly secured to at least one part of said gas-tight housing.

2. An organic EL device according to above paragraph 1 wherein said preformed moisture-absorbing body comprises a desiccant and a resin component.

3. An organic EL device according to above paragraph 1 wherein said preformed moisture-absorbing body is an artifact obtained by shaping a mixture of a desiccant and a resin component into a body.

4. An organic EL device according to the above paragraph 2 or 3 wherein the desiccant comprises at least one member selected from the group consisting of alkaline earth metal oxides and sulfate salts.

5. An organic EL device according to the above paragraph 2 or 3 wherein said resin component is at least one kind of gas-permeable resin.

6. A method of manufacturing an organic EL element comprising 1) providing a laminate consisting of a pair of electrodes and an organic light-emitting layer sandwiched therebetween, 2) providing a gas-tight housing accommodating said laminate and shielding off the external atmosphere and 3) disposing a desiccating means apart from said laminate within said gas-tight housing, characterized in that the method includes a step of fixing said preformed moisture-absorbing body as desiccating means to at least one part of said gas-tight housing.

7. A method of manufacturing an organic EL element comprising 1) providing a laminate consisting of a pair of electrodes and an organic light-emitting layer sandwiched therebetween, 2) providing a airtight housing accommodating said laminate and shielding off the external atmosphere and 3) disposing a desiccating means apart from said laminate within said airtight housing, characterized in that the method includes a first step comprising fabricating a preformed moisture-absorbing body comprising a desiccant and a resin component and a second step comprising fixing said preformed moisture-absorbing body as desiccating means to at least one part of said gas-tight housing.

8. A manufacturing method according to the above paragraph 7 wherein said first step comprises providing a mixture consisting of a desiccant and a resin component into the preformed moisture-absorbing body.

DETAILED DESCRIPTION OF THE INVENTION

Figure 1:
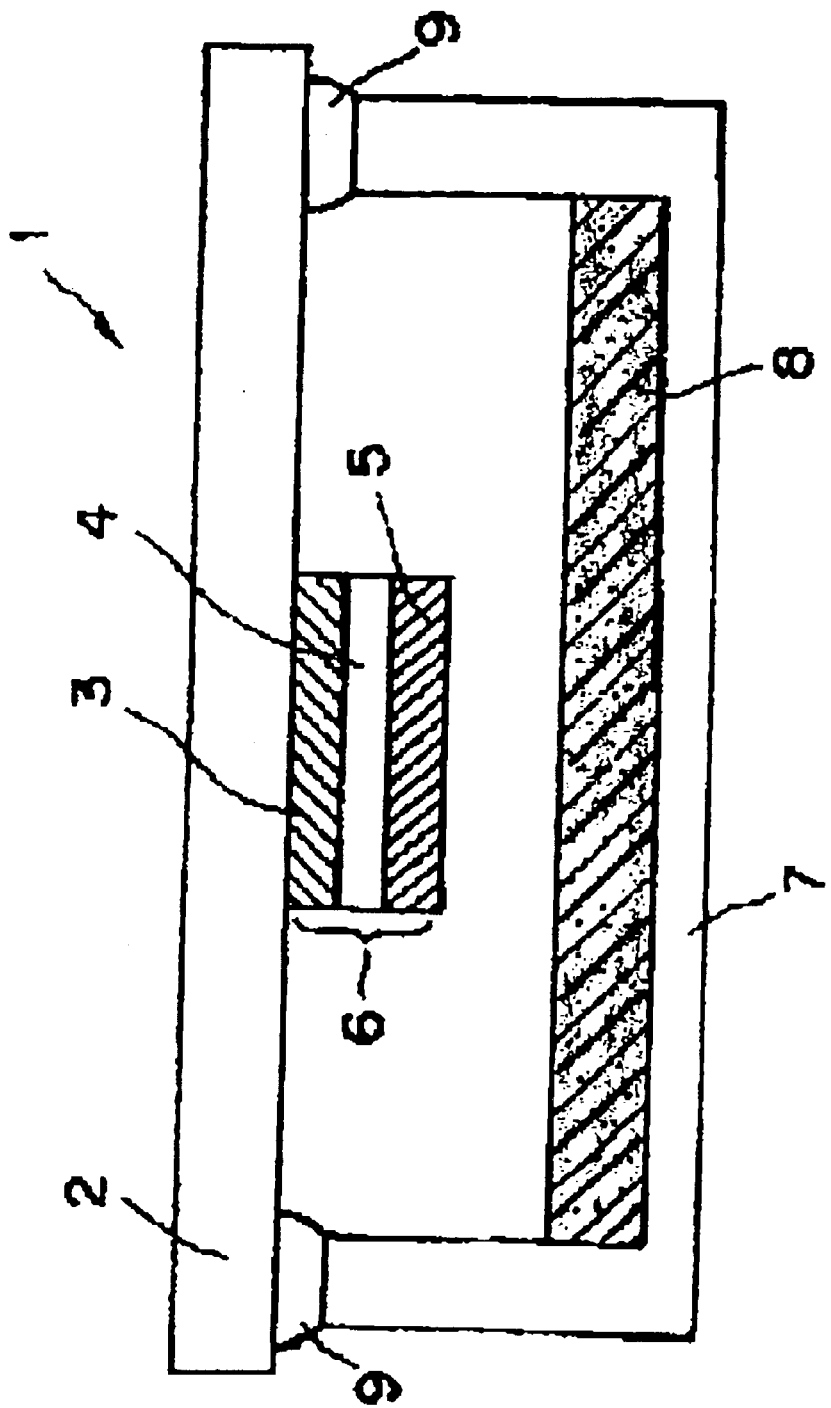
FIG. 1 is a schematic diagram (sectional view) showing an organic EL device according to embodiments of the present invention.

An organic EL device according to the present invention comprises an organic EL device comprising 1) a laminate consisting of a pair of electrodes and an organic light-emitting layer sandwiched between the two electrodes, 2) a gas-tight housing accommodating said laminate and shielding off the external atmosphere and 3) a desiccating means disposed apart from said laminate within said gas-tight housing, wherein the desiccating means is a preformed moisture-absorbing body. The preformed moisture-absorbing body is fixedly secured inside the gas-tight housing. Thus, except for the use of the preformed moisture-absorbing body as desiccating means, the organic EL device according to the present invention may be have the same structural components as those of previously known organic EL devices [i.e., electrodes (positive and negative), organic light-emitting layer, casing (gas-tight housing), substrate, carrier, etc.]. In certain embodiments, an organic EL device (1), as depicted in FIG. 1, comprises a glass substrate (2) attached to an ITO electrode (3), an organic light-emitting layer (4), and a negative electrode (5). The ITO electrode (3), the organic light-emitting layer (4), and the negative electrode (5) together form a laminate (6). The device (1) further comprises a desiccating means (8) not contacting said laminate (6) and a glass seal can (7) that is attached to the glass substrate (2) by a sealant (9).

While the laminate (6) for the organic EL device (1) illustrated in FIG. 1 comprises a three-layer structure (i.e., the ITO electrode (3), the organic light-emitting layer (4) and the negative electrode (5)), the invention may optionally be embodied as a multi-layer structure additionally comprising one or more carrier transport layers, such as an electron transport layer, a positive hole transport layer, or the like.

The desiccating means (8) is disposed apart from said laminate (6). The laminate (6) and desiccating means (8) are sealed inside a gas-tight housing defined by said glass substrate (2) and the glass seal can (7) jointed with said sealant (9) in gas-tight relation. The interior of the gas-tight housing is filled with a dehumidified inert gas or maintained in a vacuum or substantially vacuum condition.

In the present embodiment, said preformed moisture-absorbing body (8) as desiccating means has been fixed to said gas-tight housing in at least one location internally thereof.

The preformed moisture-absorbing body (8) is not particularly restricted, insofar as the moisture within the gas-tight housing may be reduced or removed. For example, a formed body (8) comprising a desiccant and a resin component can be used with advantage. The shape of the preformed moisture-absorbing body (8) is not particularly restricted but can be judiciously selected according to the intended use or application of the end product and the location of use, among other variables. Thus, a sheet, pellet, tablet, film, and grain(granule) can be cited as examples. The size of the body can be judiciously selected with reference to the size of the housing, among other variables.

The desiccant component of the preformed moisture-absorbing body (8) is not particularly restricted in its capability for adsorbing moisture. It is preferred, however, that the desiccant component of the preformed moisture-absorbing body (8) comprise a compound which is not only capable of chemical adsorption of moisture but is also able to retain a solid state after the adsorption. As examples of such compound, there can be mentioned oxides of metals and salts of metals with inorganic acids or organic acids. In the practice of the invention, it is particularly preferred that the desiccant component of the preformed moisture-absorbing body (8) comprise at least one member selected from among alkaline earth metal oxides and sulfate salts.

The alkaline earth metal oxides include calcium oxide (CaO), barium oxide (BaO) and magnesium oxide (MgO), among others.

The sulfate salts include lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$), among others. Aside from the above, various hygroscopic organic materials can also be used as the desiccant (8) in the practice of the invention.

Also, the resin component of the preformed body (8) is not particularly restricted so long as it does not interfere with the moisture-removing action of the desiccant but is preferably a highly gas-permeable material (that is to say a material with a low gas barrier potential, particularly a gas-permeable resin). As examples of such material, there can be mentioned polymeric materials inclusive of polyolefins, polyacrylic acids or esters, polyacrylonitrile, polyamides, polyesters, epoxy resins and polycarbonates. Among them, polyolefin materials are preferred for purposes of the invention. Specifically, polyethylene, polypropylene, polybutadiene, polyisoprene, and the corresponding copolymers can be mentioned.

In the present invention, the amounts of the desiccant and resin component can be judiciously established according to the respective types. Usually, however, based on 100 weight % of the desiccant and resin component combined, the amount of the desiccant component of the preformed body (8) may be about 30 weight % to about 85 weight % and that of the resin component of the preformed body (8) may be about 70 weight % to about 15 weight %. The preferred proportions are about 40 weight % to about 80 weight % of the desiccant and about 60 weight % to about 20 weight % of the resin component. The most preferred are about 50 weight % to about 70 weight % of the desiccant component of the preformed body (8) and about 50 weight % to about 30 weight % of the resin component of the preformed body (8).

The preformed moisture-absorbing body (8) can be produced by blending the above component materials evenly and forming the blend into an optional shape. In such cases, the desiccant or gas absorbent, is preferably dried thoroughly prior to formulation. Moreover, the blending with the resin component of the preformed body (8) may be carried out under heating as needed to prepare a molten mass. A molding technology can be used, including any known forming(molding) or granulation technology, such as press-forming (inclusive of hot-pressing), extrusion, or granulation with a rolling granulator, a twin-screw granulator, or the like.

In the present invention, the preformed moisture-absorbing artifact (8) is preferably a body obtained by forming a mixture consisting of a desiccant and a resin component. In order to avoid untoward effects after installation into the organic EL device (1), the preformed moisture-absorbing body (8) is preferably substantially free of impurities such as solvents.

Furthermore, in case the preformed moisture-absorbing body (8) is a sheet, this sheet can be stretched prior to use with advantage. This stretching can be carried out according to known methods, and may be uniaxial stretching or biaxial stretching. Moreover, it is also possible to use, with advantage, a body prepared using a fluororesin as the resin component by processing a composition comprising the resin and a desiccant into a sheet and subjecting the sheet to fibrillation.

When so formed into a sheet, the thickness of the preformed moisture-absorbing body (8) can be judiciously selected according to the intended use of the end product. For example, when the organic EL device (1) of the invention is to be used as a portable telephone display device, the usual thickness may be from about 50 $\mu$m to about 400 $\mu$m, preferably from 100 $\mu$m to 200 $\mu$m.

In the organic EL device (1) according to the invention, said preformed moisture-absorbing body (8) is fixedly secured to a gas-tight housing in at least one position. The fixing method is not particularly restricted so long as the artifact (8) can be positively secured to the gas-tight housing. For example, method of bonding the preformed moisture-absorbing body (8) to the gas-tight housing may include the use of a known self-adhesive or adhesive (preferably a solvent-free adhesive), thermal fusing, or fastener means such as screws.

By way of illustration, the method of fixing the moisture-absorbing body (8) may include: forming a self-adhesive layer carrying a release sheet on the moisture-absorbing sheet, peeling off the release sheet prior to bonding, and fixing the moisture-absorbing sheet to the housing with the aid of the self-adhesive layer. It is also possible to secure the artifact (8) to the gas-tight housing with a solvent-free adhesive comprising an ethylene-vinyl alcohol copolymer (EVOH) or the like. As the solvent-free adhesive, a commercial product can be utilized.

In the practice of the present invention, the roughness of inside surfaces of the gas-tight housing (defined by the glass substrate (2) and the glass seal can (7)) may be may be increased prior to fixing the preformed moisture-absorbing artifact in order to provide a firmer bond between the preformed moisture-absorbing body (8) and the gas-tight housing. The proper surface roughness (Ra) can be judiciously selected according to the material constituting the preformed moisture-absorbing body or the gas-tight housing and may generally be about 0.2~0.6 $\mu$m.

A method of manufacturing an organic EL device (1) according to the invention is characterized by providing an organic EL device comprising 1) a laminate (6) consisting of a pair of electrodes (3), (5) and at least one organic light-emitting layer (4) sandwiched the two electrodes (3), (5), 2) a gas-tight housing accommodating said laminate (6), and 3) a desiccating means disposed apart from said laminate within said gas-tight housing. The method further comprises fixing a preformed moisture-absorbing body (8) as desiccating means to at least one part of said gas-tight housing.

Except that it includes a step of fixing a preformed moisture-absorbing body (8) as desiccating means to at least one part of said gas-tight housing, the manufacturing method of the invention may follow the known manufacturing procedure or protocol.

The manufacturing method of the invention preferably comprises a first step comprising fabricating a preformed moisture-absorbing artifact (8) composed of a desiccant and a resin component and a second step comprising fixing said preformed moisture-absorbing artifact (8) as desiccating means to at least one internal part of said gas-tight housing.

Referring to the above first step, the preformed moisture-absorbing body (8) is preferably an artifact fabricated by forming (molding) a mixture of said desiccant and resin component. Preferably, the preformed moisture-absorbing body (8) is substantially free of impurities such as solvents, thus obviating the trouble due to evaporation of solvent residues in the artifact with the passage of time. The proportions of the desiccant and resin component may be similar to those mentioned hereinbefore.

The fixing of the preformed moisture-absorbing body (8) can be effected in the same manner as described above herein. The fixing location is not particularly restricted as long as the gas-tight housing can be successfully purged of moisture. When the preformed moisture-absorbing body (8) is a sheet, for instance, this sheet (8) may be secured in a location isolated from the laminate (6), for example to a part of the internal wall (or all over the wall) of the gas-tight housing as illustrated in FIG. 1. In other words, all that is necessary is to insure that said sheet be secured in such a manner that it will not come into contact with the laminate (6). As the sheet is thus secured in position, the moisture can be removed from the housing so that the formation of non-emission areas (the so-called dark spots) can be suppressed or precluded, thus providing a display device of high display quality.

In the present invention, particularly because a preformed moisture-absorbing body (8) is used as desiccating means, the organic EL device (1) can be easily and positively provided with a desiccating function.

The installation of desiccating means can be mechanized. As a result, chances for moisture infiltrating into the internal atmosphere are reduced so that an atmosphere with a highly desiccated initial state can be established. Thus, it is not only possible to manufacture a highly desiccated organic EL device but also possible to effectively remove any moisture after manufacture so that a more dependable organic EL device can be made available on a commercial scale.

Moreover, unlike the conventional system in which a desiccant (powders) is used as it is, the trouble of powders being dislodged and scattered within the gas-tight housing can be precluded. In addition, whereas the use of powders requires a discrete packing space, this is no longer a requisite in the present invention, so that the invention contributes to device down-sizing and weight reduction.

When a preformed moisture-absorbing body prepared by molding a desiccant-resin mixture is used as desiccating means, the performance aging of the organic EL device can be more positively prevented. Since there are substantially no impurities such as a solvent remaining in the preformed moisture-absorbing body, the untoward effect of such impurities can be avoided.

In accordance with the manufacturing method of the present invention, wherein a preformed moisture-absorbing body (8) is secured to at least one part of a gas-tight housing, assembling of the organic EL device (1) can be carried out at a temperature not exceeding 50° C. (preferably at room temperature) so that the method is advantageous cost-wise, too. Moreover, it is not necessary to pay attention to the heat resistance of the gas-tight housing; thus, gas-tight housings made of various materials can be utilized.

The organic EL device (1) of the present invention, which has the above characteristics, is useful for such applications as the flat panel displays of portable telephones, audio equipment and various meters, as well as the computer display, television display and other display devices.

EXAMPLES

The following examples are intended to delineate the characteristics of the invention in further detail. It should, however, be understood that these examples are by no means definitive of the invention.

Example 1

A preformed moisture-absorbing body in the pellet form was produced.

The desiccant CaO was thoroughly dehydrated by heating at 900° C. for 1 hour, then cooled in a falling drying rate atmosphere of 180–200° C., and finally cooled to room temperature. Then, 65 weight % of this CaO and 35 weight % of the resin component polyethylene (mol. wt. ca 100,000) were dry-blended and melt-kneaded under heating at about 230° C. The resulting mass was hot-pressed into a preformed moisture-absorbing pellet (1.5 mmØ×300 μm thick).

Figure 2:
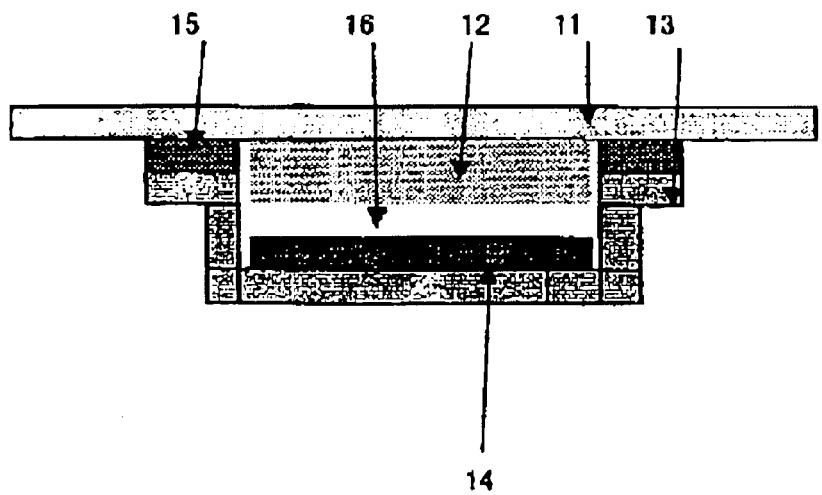
FIG. 2 is a schematic diagram (sectional view) of the organic EL device manufactured in accordance with one embodiment of the present invention as described in Example 1.

The pellet was disposed in the cavity of an organic EL device. FIG. 2 is a schematic cross-sectional view showing an organic EL device equipped with the above preformed moisture-absorbing artifact. FIG. 2 schematically illustrates an organic EL display element (12) mounted on a glass substrate (11). This display element is accommodated in the metallic cavity (gas-tight housing) (13) and the preformed moisture-absorbing body in a pellet form (14) is heat-bonded to the bottom of the cavity (13). The cavity (13) mentioned above is sealed with a known UV-curable epoxy sealant (15). An inert gas (e.g. argon gas), dehumidified in advance, is sealed inside the cavity (16).

Accelerated Organic EL Test Method

Figure 3:
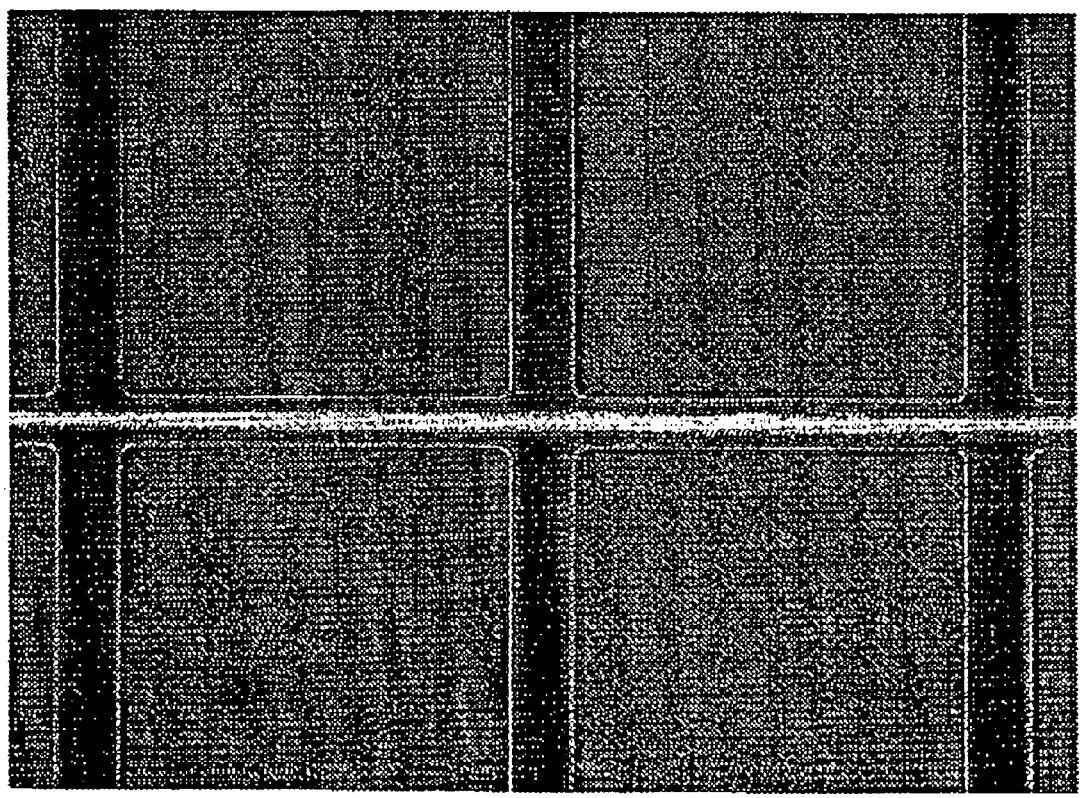
FIG. 3 is an image of the organic EL device according to the embodiment of the present invention described in Example 1 prior to an accelerated moisture absorption test.
Figure 4:
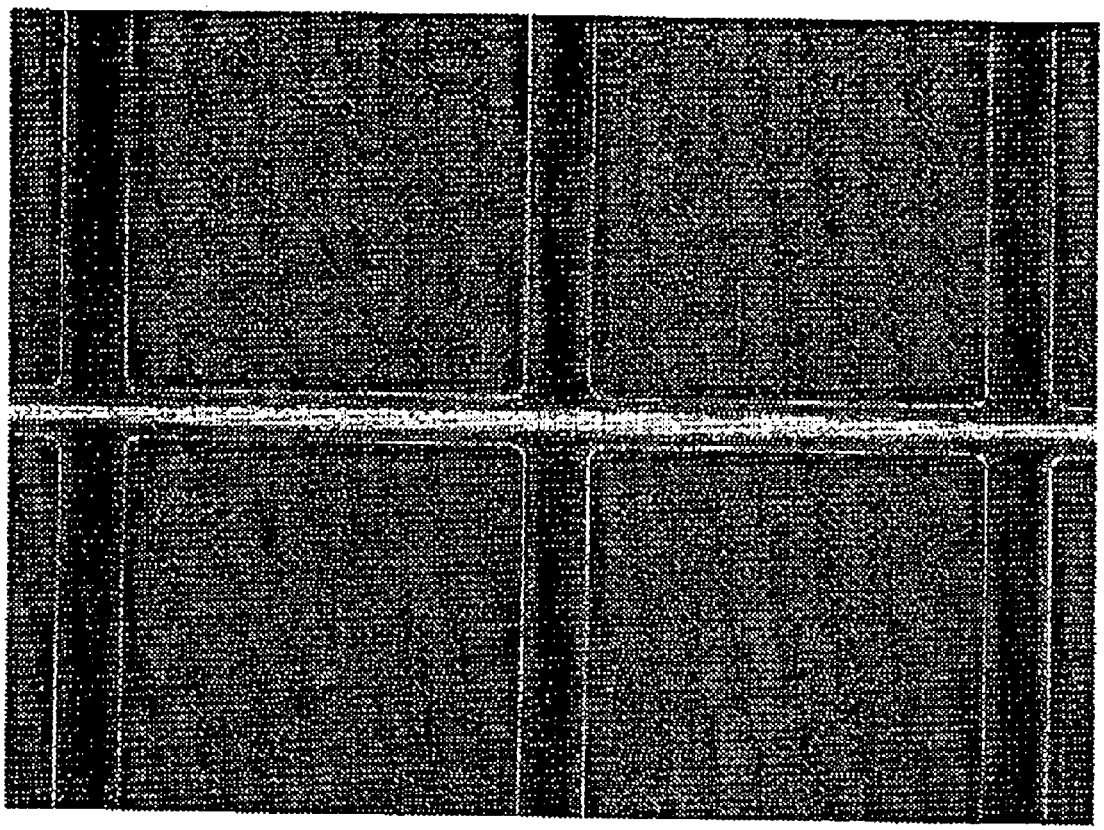
FIG. 4 is an image of the organic EL device according to the embodiment of the present invention described in Example 1 after an accelerated moisture absorption test.

The organic EL device fabricated in Example 1 was subjected to an accelerated moisture-absorption test. In this accelerated moisture-absorption test, the organic EL device was allowed to sit in an atmosphere controlled at 60° C. and 90% R.H. for 500 hours and the condition after exposure was compared with the condition before exposure. The conditions before and after exposure are shown in FIGS. 3 and 4, respectively.

Comparative Example 1

Figure 5:
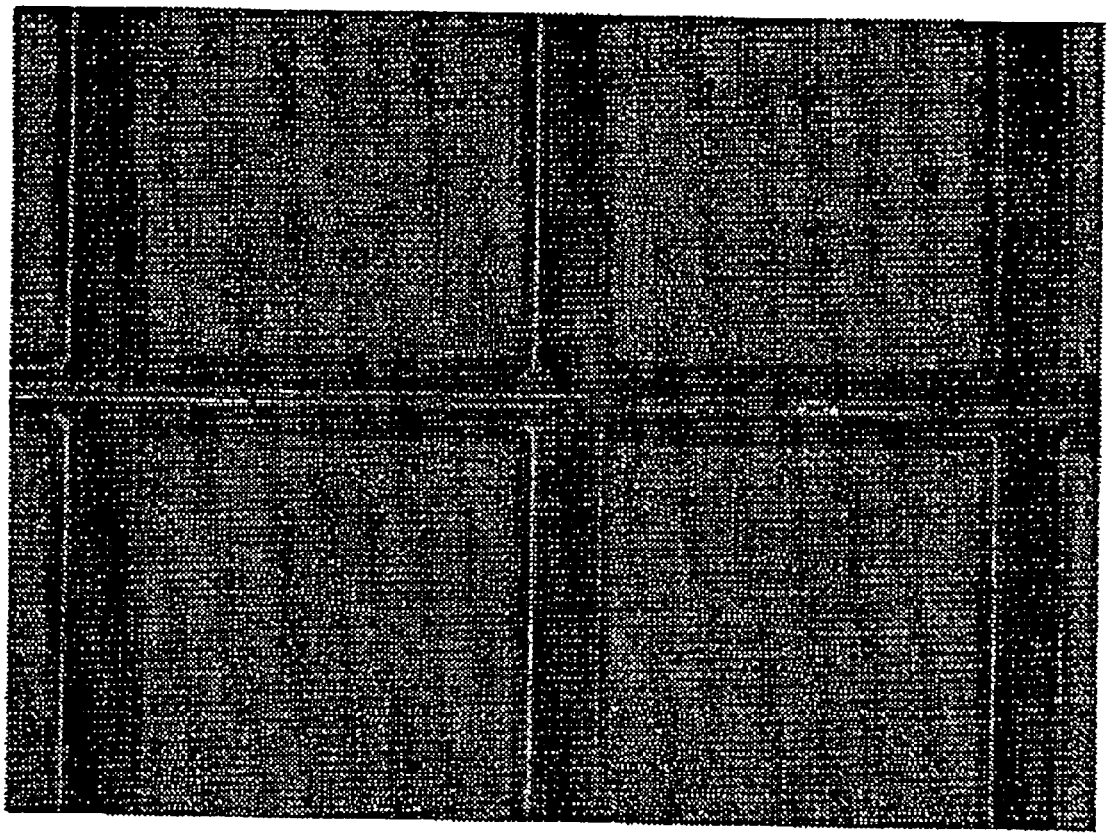
FIG. 5 is an image of a prior art organic EL device according to Comparative Example 1 prior to an accelerated moisture absorption test.
Figure 6:
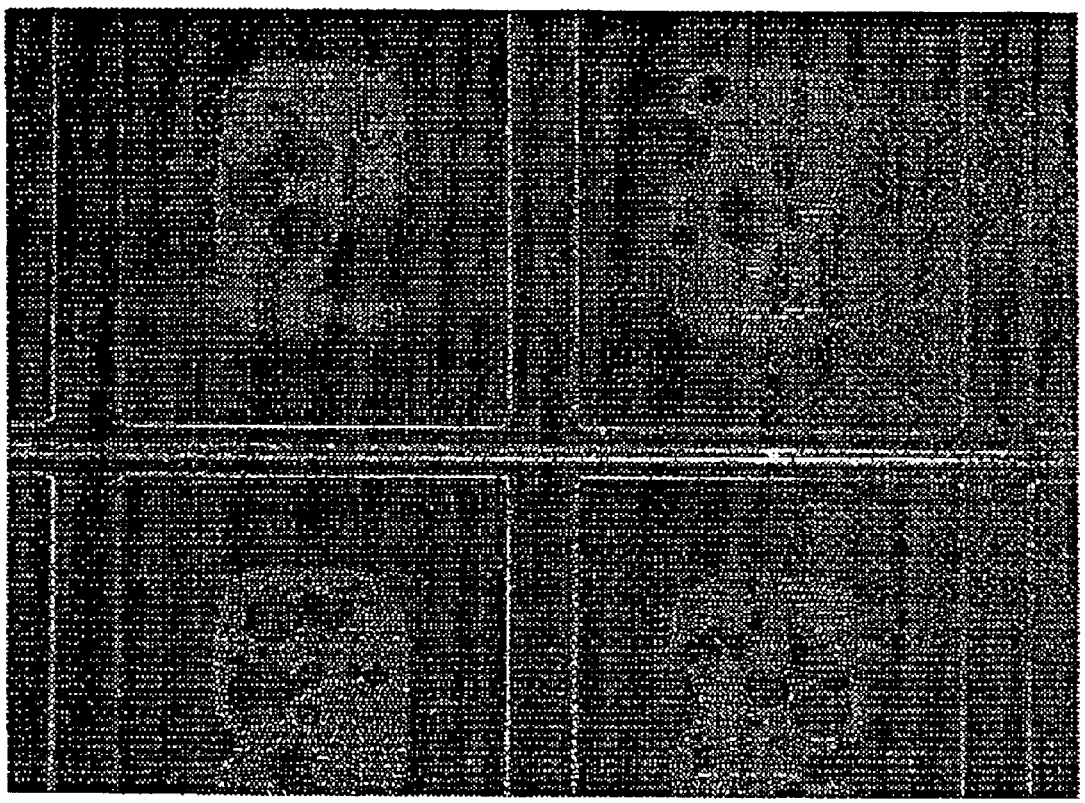
FIG. 6 is an image of a prior art organic EL device according to Comparative Example 1 after an accelerated moisture absorption test.

The accelerated organic test method described above was performed with the organic EL device not equipped with the preformed moisture-absorbing body. The conditions of the Comparative Example 1 device before and after exposure are shown in FIGS. 5 and 6, respectively.

Comparative Example 2

Figure 7:
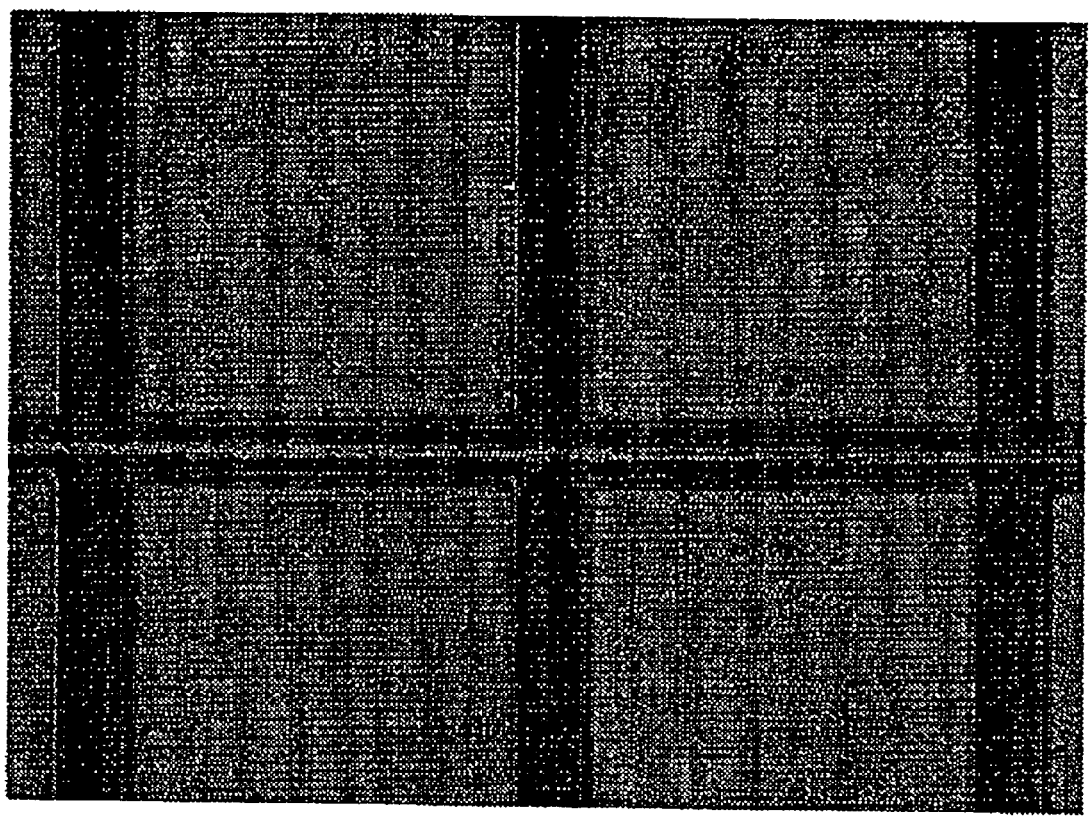
FIG. 7 is an image of a prior art organic EL device according to Comparative Example 2 prior to an accelerated moisture absorption test.
Figure 8:
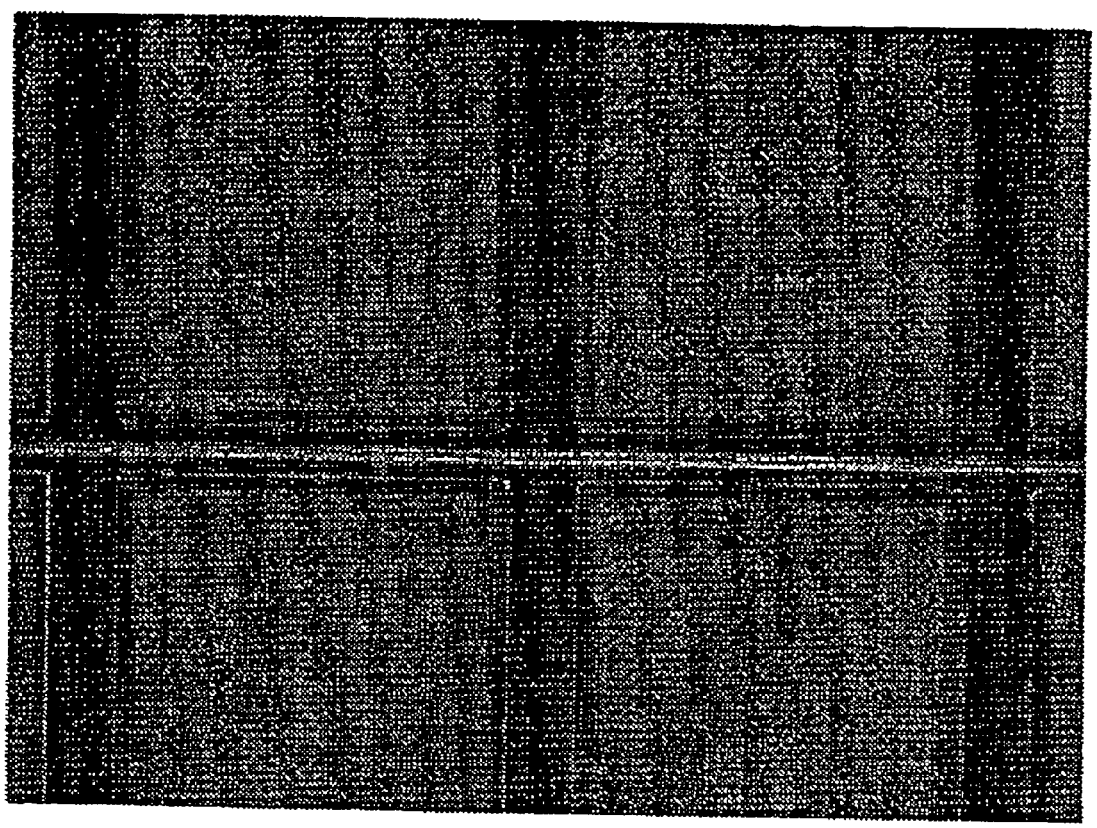
FIG. 8 is an image of a prior art organic EL device according to Comparative Example 2 after an accelerated moisture absorption test.

The accelerated organic test method described above was also performed using an organic EL device equipped with the conventional desiccating means (the same quantity of BaO powders as the CaO used in Example 1). The conditions of the Comparative Example 2 device before and after exposure are shown in FIGS. 7 and 8, respectively.

Comparison of Test Results

It will be apparent from FIGS. 5 and 6 and FIGS. 7 and 8 that the device of Comparative Example 1 after exposure was dark substantially throughout, with a pale gray area in the center being the sole remaining light-emission zone, and that the device according to Comparative Example 2 showed definite dark spots before and after exposure, although the defects were not so prominent as in Comparative Example 1.

In contrast, as shown in FIGS. 3 and 4, the organic EL device according to the invention showed neither luminance aging nor growth of dark spots, retaining the initial emission zone intact and demonstrating the expected desiccation characteristic.

What is claimed is:

1. A method of manufacturing an organic EL device comprising 1) a laminate consisting of an opposed pair of electrodes and an organic light-emitting layer sandwiched between the electrodes, 2) a gas-tight housing accommodating said laminate and shielding off the external atmosphere and 3) a desiccating means disposed in isolation from said laminate within said gas-tight housing, the method comprising:

forming a sheet-like preformed moisture-absorbing body comprising a desiccant and a resin component outside said gas-tight housing to prevent generation of impurities inside said gas-tight housing, which is generated during the formation of said preformed moisture-absorbing body; and fixing said preformed moisture-absorbing body as desiccating means to at least one inner part of said gas-tight housing.

2. The manufacturing method according to claim 1 wherein the forming of said preformed moisture-absorbing body comprises providing a mixture consisting of said desiccant and said resin component.

3. The method according to claim 1 wherein said resin component is selected from a group consisting of polyethylene, polypropylene, polybutadiene and polyisoprene.

4. The method according to claim 1 wherein the amount of said desiccant is about 30 to 85 weight % and that of said resin component is about 70 to 15 weight % based on 100 weight % of the desiccant and resin component combined.

5. The method according to claim 1 wherein the amount of said desiccant is about 40 to 80 weight % and that of said resin component is about 60 to 20 weight % based on 100 weight % of the desiccant and resin component combined.

6. The method according to claim 1 wherein the amount of said desiccant is about 50 to 70 weight % and that of said resin component is about 50 to 30 weight % based on 100 weight % of the desiccant and resin component combined.

7. The manufacturing method according to claim 1 wherein the forming of said preformed moisture-absorbing body comprises integrating said desiccant and said resin component without using a solvent.

8. The method according to claim 1 wherein said resin component is selected from a group consisting of polyolefins, polyacrylic acids or esters, polyacrylonitrile, polyamides, polyesters, epoxy resins and polycarbonates.

9. The method according to claim 8 wherein said resin component is polyolefin.

* * * * *